US009263660B2

(12) United States Patent
Liu et al.

(10) Patent No.: US 9,263,660 B2
(45) Date of Patent: Feb. 16, 2016

(54) GENERATOR

(75) Inventors: Peng Liu, Beijing (CN); Wen-Mei Zhao, Beijing (CN); Li Qian, Beijing (CN); Liang Liu, Beijing (CN); Pi-jin Chen, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 85 days.

(21) Appl. No.: 12/583,425

(22) Filed: Aug. 20, 2009

(65) Prior Publication Data

US 2010/0212711 A1    Aug. 26, 2010

(30) Foreign Application Priority Data

Feb. 20, 2009   (CN) .......................... 2009 1 0105490

(51) Int. Cl.
| | |
|---|---|
| *H01L 35/30* | (2006.01) |
| *H01L 35/32* | (2006.01) |
| *H01L 35/28* | (2006.01) |
| *H01L 35/34* | (2006.01) |

(52) U.S. Cl.
CPC ............... *H01L 35/30* (2013.01); *H01L 35/28* (2013.01); *H01L 35/32* (2013.01); *H01L 35/34* (2013.01)

(58) Field of Classification Search
CPC ......... H01L 35/28; H01L 35/30; H01L 35/32; H01L 35/34
USPC ....................................................... 136/206
See application file for complete search history.

(56) References Cited

U.S. PATENT DOCUMENTS

| | | | | |
|---|---|---|---|---|
| 2,984,696 | A | * | 5/1961 | Shaffer ..................... 136/206 |
| 4,106,952 | A | * | 8/1978 | Kravitz ..................... 136/206 |
| 4,159,706 | A | | 7/1979 | Mahdjuri |
| 4,166,880 | A | * | 9/1979 | Loferski et al. ............... 428/457 |
| 4,822,120 | A | | 4/1989 | Fan et al. |
| 5,517,339 | A | * | 5/1996 | Riccobono et al. ............. 359/15 |
| 6,282,907 | B1 | * | 9/2001 | Ghoshal ..................... 62/3.7 |
| 6,348,650 | B1 | * | 2/2002 | Endo et al. ................... 136/201 |
| 7,045,108 | B2 | | 5/2006 | Jiang et al. |
| 7,183,003 | B2 | | 2/2007 | Leu et al. |

(Continued)

FOREIGN PATENT DOCUMENTS

| | | |
|---|---|---|
| CN | 2302262 | 12/1998 |
| CN | 2457521 Y | 10/2001 |

(Continued)

OTHER PUBLICATIONS

H. Mishra, T. Fisher, T.D. Sands, "Carbon Nanotube Array Electrical INterfaces for Thermoelectrics", Purdue e-Pubs, Birk Poster Session, Apr. 23, 3008, Paper 25.*

(Continued)

*Primary Examiner* — Marla D McConnell
(74) *Attorney, Agent, or Firm* — Novak Druce Connolly Bove + Quigg LLP (57) ABSTRACT

A generator includes a heat-electricity transforming device and a heat collector. The heat-electricity transforming device is configured to transform heat into electricity. The heat collector includes at least one heat absorption module. The at least one heat absorption module includes a carbon nanotube structure. The at least one heat absorption module is connected to the heat-electricity transforming device and transfers heat to the heat-electricity transforming device.

13 Claims, 9 Drawing Sheets

(56) References Cited

U.S. PATENT DOCUMENTS

| | | | |
|---|---|---|---|
| 7,608,293 | B2 | 10/2009 | Huang et al. |
| 2001/0031365 | A1* | 10/2001 | Anderson et al. ............ 428/432 |
| 2003/0117770 | A1* | 6/2003 | Montgomery et al. ....... 361/687 |
| 2004/0053780 | A1 | 3/2004 | Jiang et al. |
| 2005/0002849 | A1 | 1/2005 | Mitsui et al. |
| 2005/0069701 | A1 | 3/2005 | Watanabe et al. |
| 2005/0095938 | A1 | 5/2005 | Rosenberger et al. |
| 2006/0048808 | A1 | 3/2006 | Ruckman et al. |
| 2006/0275956 | A1* | 12/2006 | Konesky ....................... 438/128 |
| 2007/0051965 | A1 | 3/2007 | Du et al. |
| 2007/0166223 | A1 | 7/2007 | Jiang et al. |
| 2008/0049380 | A1 | 2/2008 | Miyahara et al. |
| 2008/0170982 | A1 | 7/2008 | Zhang et al. |
| 2008/0178920 | A1* | 7/2008 | Ullo ............................... 136/204 |
| 2008/0248235 | A1 | 10/2008 | Feng et al. |
| 2008/0299031 | A1 | 12/2008 | Liu et al. |
| 2008/0314568 | A1* | 12/2008 | Zhan et al. .................... 165/135 |
| 2010/0236543 | A1 | 9/2010 | Oetting et al. |

FOREIGN PATENT DOCUMENTS

| | | |
|---|---|---|
| CN | 2486079 | 4/2002 |
| CN | 1474113 | 2/2004 |
| CN | 2641536 Y | 9/2004 |
| CN | 200520120563.0 | 12/2006 |
| CN | 201014777 Y | 1/2008 |
| CN | 101239712 | 8/2008 |
| CN | 101284662 A | 10/2008 |
| CN | 101314464 A | 12/2008 |
| DE | 19704323 | 7/1998 |
| DE | 102006039804 | 2/2008 |
| EP | 1529857 | 5/2005 |
| JP | 52-116942 | 9/1977 |
| JP | 57-92654 | 6/1982 |
| JP | 58-52932 | 3/1983 |
| JP | S58-52932 | 3/1983 |
| JP | 62-59342 | 3/1987 |
| JP | 5-79708 | 3/1993 |
| JP | 2001-226108 | 8/2001 |
| JP | 2003-160322 | 6/2003 |
| JP | 2004-211718 | 7/2004 |
| JP | 2005-96055 | 4/2005 |
| JP | 2005-199666 | 7/2005 |
| JP | 2005199666 | 7/2005 |
| JP | 2006-1820 | 1/2006 |
| JP | 2006114826 | 4/2006 |
| JP | 2006-229168 | 8/2006 |
| JP | 2006-265079 | 10/2006 |
| JP | 2007-27088 | 2/2007 |
| JP | 2007-183252 | 7/2007 |
| JP | 2008-44820 | 2/2008 |
| JP | 2009-141079 | 6/2009 |
| TW | I253467 | 4/2006 |
| TW | 200639119 | 11/2006 |
| TW | I282326 | 7/2012 |
| WO | WO2007015670 | 2/2007 |

OTHER PUBLICATIONS

A. Kis, G. Csanyi, J.P. Salvetat, T.-N. Lee, E. Couteau, A.J. Kulik, W Benoit, J. Brugger, L. Forro, "Reinforcement of single-walled carbon nantoube bundles by intertube bridging", Science, vol. 3, p. 153-157. 2004.*

M. Park, B.A. Cola, T. Siegmund, J. Xu, M.R. Macchmann, T.S. Fisher, H. Kim, "Effects of a carbon nanotube layer on electrical contact resistance between copper substrates", Nanotechnology, vol. 17, p. 2294-2303, 2006.*

C. Zhu, C. C Cheng, Y.E. He, L. Wang, T.L. Wong, K.K. fung, N. Wang, "A self-entanglement mechanism for continuous pulling of carbon nanotube yarns", Carbon, vol. 49, p. 4996-5001. 2011.*

A.C. Dillon, A.H. Mahan, R. Deshpande, J.L. Alleman, J.L. Blackburn, P.A. Parillia, M.J. Heben, C. Engtrakul, K.E.H., Gilbert, K.M. Jones R. To, S.-H. Lee, J.H. Lehman, "Hot-wire chemical vapor synthesis for a variety of nano-materials with novel applications", Thin Solid Films, vol. 501, p. 216-220, 2006.*

Zhang, et al "Strong, transparent, multifunctional, carbon nanotube sheets", Science, 309, 1215-1219, 2005.*

Maschmann, et al "Vertical single- and double-walled carbon nanotubes grown from modifed porous anodic alumina templates" Nanotechnology, 2006, 3925-3929.*

Translation of CN 200520120563, published as CN2847686, pp. 1-6.*

Xie, et al "Dispersiona dn alignment of carbonnanotubes in a polymer matrix: a review" Materials Science and Enginnering, 2005, p. 89-112.*

Zhu et al., Carbon Nanometer Tube, China Machine Press, Jan. 2003, pp. 195-198.

Liang Jintao, Liu Junhua, Optimization of a IR detector of Microcantilever with Carbon Nanometer Tube, Acta Optica Sinica, Nov. 2004, pp. 1547-1551, vol. 24 No. 11.

Jia-qing Wu et al., Comparative Study of the N-S and E-W Orientation of Tubes for Evacuated Domestic Water Heaters, Oct. 1988, p. 396-405, vol. 9, Acta Energiae Solaris Sinica.

Xiao-gang Sun, "Investigation on Radar Absorbing Properties of Carbon Nanotube", Journal of Synthetic Crystals, Feb. 2005, vol. 34, No. 1, p. 174-177 (Wherein, abstract maybe relevant).

* cited by examiner

GENERATOR

BACKGROUND

1. Technical Field

The present disclosure relates to generators and, in particular, to a generator based on carbon nanotubes.

2. Description of the Related Art

The heat-electricity transforming rate of a typical generator obeys the following formula:

$$\Phi_{max} = \frac{[(T_1 - T_2)/T_1] \times [(1 + Z\overline{T})^{1/2} - 1]}{[(1 + Z\overline{T})^{1/2} + T_2/T_1]},$$

wherein $T_1$ is temperature of a high temperature area of the generator, $T_2$ is temperature of a low temperature area of the generator, Z is a factor relating to material, and $\overline{T}=(T_1+T_2)/2$. As described above, the transforming rate relates to the difference in temperature between the high temperature area and the low temperature area besides the properties of the heat-absorbing material. Therefore, increasing the temperature of the high temperature area can improve the transforming rate of the generator.

Figure 9:
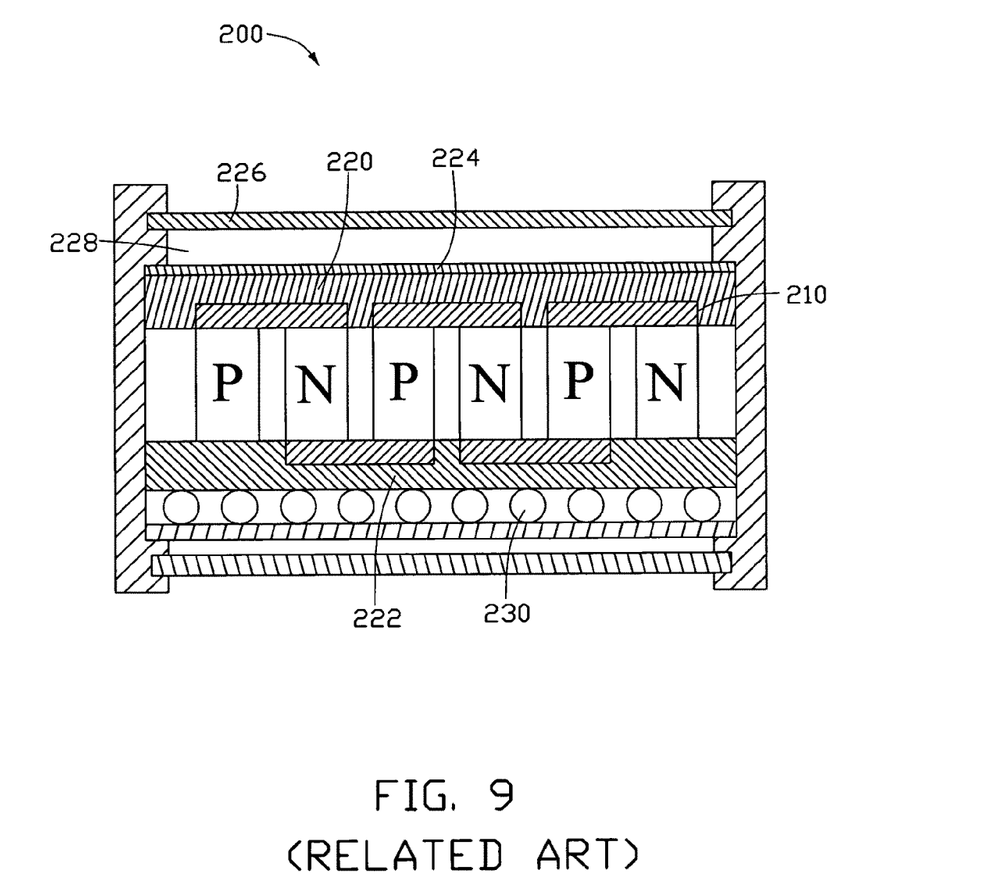
FIG. 9 is a schematic, cross-sectional view of a typical generator.

Referring to FIG. 9, a typical generator 200 includes a heat-electricity transforming device 210, a heat-receiving area 220, a cooling area 222, a nickel-chromium layer 224, a glass plate 226, and a heat sink 230. A vacuum container 228 is defined between the glass plate 226 and the heat-receiving area 220. The heat-receiving area 220 and the cooling area 222 are disposed on opposite ends of the heat-electricity transforming device 210. The nickel-chromium layer 222 is disposed on a surface of the heat-receiving area 220 and configured to absorb heat. However, the nickel-chromium layer 224 has a lower heat-absorbing rate, thereby decreasing the heat-electricity transforming rate of the generator 200. The nickel-chromium layer 224 may reflect visible light and far infrared light, which is disadvantageous for improving the temperature of the heat-receiving area 220 and further results in a poor heat-electricity transforming rate of the generator 200.

What is needed, therefore, is a new generator based on carbon nanotubes, which can overcome the above-described shortcomings.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

Figure 1:
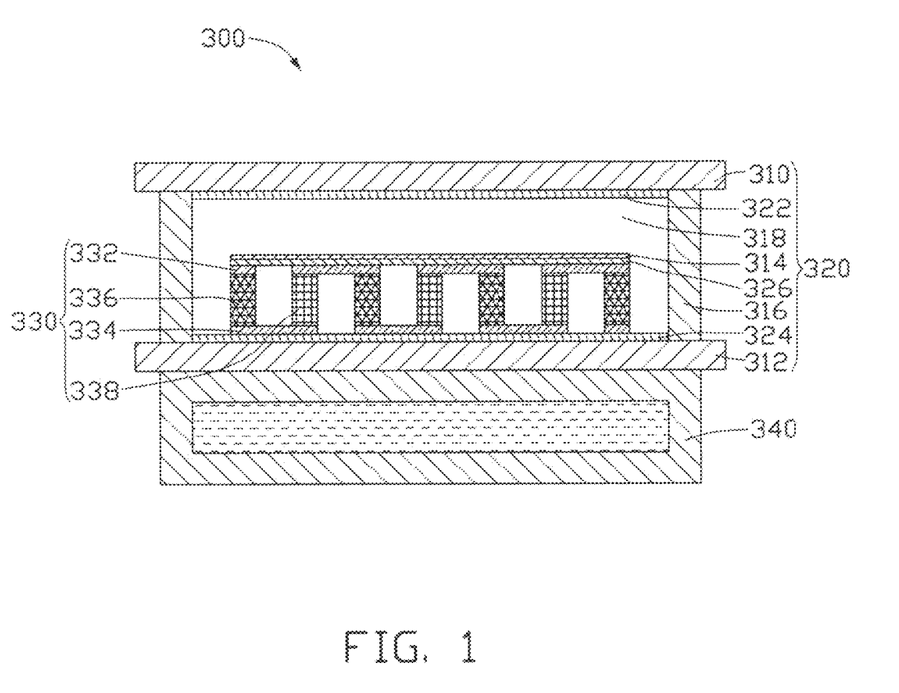
FIG. 1 is a schematic, cross-sectional view of a first embodiment of a generator.

Referring to FIG. 1, a first embodiment of a generator 300 includes a heat collector 320, a heat-electricity transforming device 330, and a cooling device 340. The heat collector 320 is configured to collect heat and transfer the heat to the heat-electricity transforming device 330. The cooling device 340 is thermally connected to the heat collector 320.

The heat collector 320 includes a top substrate 310, a bottom substrate 312, a sidewall 316, a heat absorption module 314, a first light selective transport layer 322, a second light selective transport layer 324, and a supporter 326. The top substrate 310 faces to and is spaced from the bottom substrate 312. The sidewall 316 is located between the top and bottom substrates 310, 312 and disposed on the edges of the top and bottom substrates 310, 312. A container 318 is defined by the top substrate 310, the bottom substrate 312, and the sidewall 316. The heat absorption module 314 is received in the container 318. The supporter 326 is configured to support the heat absorption module 314 and connects to the heat absorption module 314. The first light selective transport layer 322 is received in the container 318 and disposed on the top substrate 310. The second light selective-transport layer 324 is received in the container 318 and disposed on the bottom substrate 312.

The top substrate 310 may be a transparent plate made of transparent material, such as glass, transparent plastic, silicon, transparent ceramic, transparent resin, or the like. The top substrate 310 has a thickness of about 100 micrometers (μm) to about 5 millimeters (mm). In one embodiment, the top substrate 310 has a thickness of about 3 mm. The top substrate 310 may have a random shape, such as triangular, hexagonal, quadrangular, or the like. In one embodiment, the top substrate 310 is quadrangular and made of glass.

The bottom substrate 312 may be made of glass or metal material that has good thermal conductivity. The metal material may be zinc, aluminum, stainless steel, or the like. The bottom substrate 312 has a thickness of about 100 μm to about 5 mm. In one embodiment, the bottom substrate 312 has a thickness of about 3 mm. The bottom substrate 312 has a random shape, such as triangular, hexagonal, quadrangular, or the like. In one embodiment, the bottom substrate 312 is quadrangular and made of glass.

The sidewall 316 may be made of rigid material, such as glass, ceramic, or the like. The sidewall 316 has a height of about 100 μm to about 500 mm. In this embodiment the sidewall 316 has a height of about 150 μm to about 5 mm.

The container 318 may be a vacuum chamber, or filled with gas that has poor thermal conductivity or material that is transparent and insulative. The gas may be nitrogen, or the like. The transparent material, which is insulative, may be heat resistant plastic, or the like. In one embodiment, the container 318 is one insulative vacuum chamber for preventing air convection therein, thereby improving the absorption rate of the heat collector 320.

The heat absorption module 314 includes a carbon nanotube structure including a number of pure carbon nanotubes or one carbon nanotube composite structure including a matrix and a number of carbon nanotubes uniformly disposed in the matrix. The matrix may include inorganic material, metal material, polymer, or material that has an excellent thermal conductivity, such as aluminum oxide, silver, copper or nickel, or the like. Since the thickness of the heat absorption module 314 is proportional to the absorption rate thereof, the thicker the heat absorption module 314, the more heat is absorbed by the heat absorption module 314 per unit time. In one embodiment, the heat absorption module 314 has a thickness of about 3 μm.

The carbon nanotubes in the carbon nanotube structure and the carbon nanotube composite structure may be single-walled carbon nanotubes, double-walled carbon nanotubes, multi-walled carbon nanotubes, or their combinations. The single-walled carbon nanotube has a diameter of about 0.5 nanometers (nm) to about 50 nm. The double-walled carbon nanotube has a diameter of about 1.0 nm to about 50 nm. The multi-walled carbon nanotube has a diameter of about 1.5 nm to about 50 nm. The carbon nanotubes may be arranged, orderly, or disorderly. The term 'ordered carbon nanotube structure' refers to a structure where the carbon nanotubes are arranged in a consistently systematic manner, e.g., the carbon nanotubes are arranged approximately along a same direction and/or have two or more sections within each of which the carbon nanotubes are arranged approximately along a same direction (different sections can have different directions). The term 'disordered carbon nanotube structure' refers to a structure where the carbon nanotubes are arranged along many different directions, and the aligning directions of the carbon nanotubes are random. The number of the carbon nanotubes arranged along each different direction can be almost the same (e.g. uniformly disordered). The disordered carbon nanotube structure can be isotropic. The carbon nanotubes in the disordered carbon nanotube structure can be entangled with each other.

The carbon nanotube structure can be a carbon nanotube film structure with a thickness ranging from about 0.5 nm to about 1 mm. The carbon nanotube film structure can include at least one carbon nanotube film. The carbon nanotube structure can also be a linear carbon nanotube structure with a diameter ranging from about 0.5 nm to about 1 mm. The carbon nanotube structure can also be a combination of the carbon nanotube film structure and the linear carbon nanotube structure. The carbon nanotube structure can also be an array of carbon nanotubes. It is understood that any carbon nanotube structure described can be used with all embodiments.

Flocculated Carbon Nanotube Film

Figure 2:
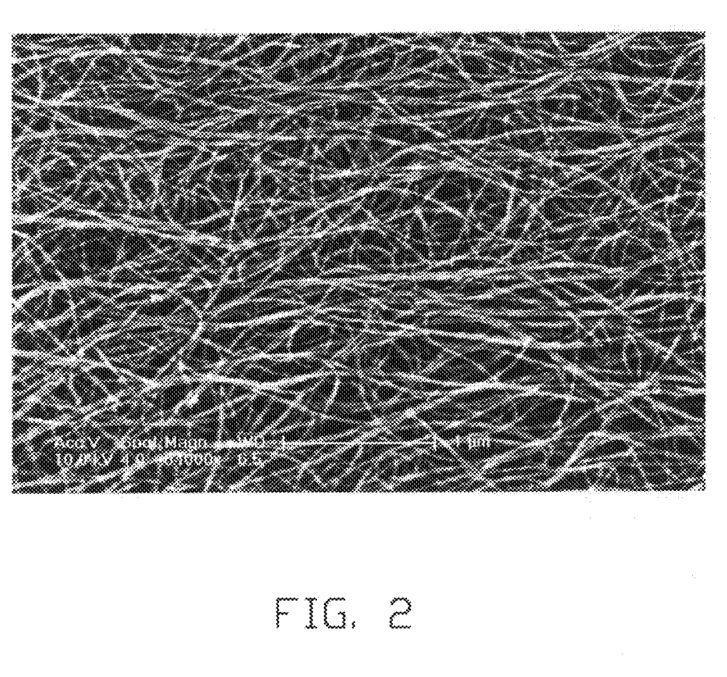
FIG. 2 is a scanning electron microscope (SEM) image of a flocculated carbon nanotube film used in the generator of FIG. 1.

In one embodiment, the carbon nanotube film may be a flocculated carbon nanotube film. Referring to FIG. 2, the flocculated carbon nanotube film can include a plurality of long, curved, disordered carbon nanotubes entangled with each other. Further, the carbon nanotubes in the flocculated carbon nanotube film can be isotropic. The carbon nanotubes can be substantially uniformly dispersed in the carbon nanotube film. Adjacent carbon nanotubes are attracted by van der Waals attractive force to form an entangled structure with micropores defined therein. It is understood that the flocculated carbon nanotube film is very porous. Sizes of the micropores can be less than 10 micrometers. The porous nature of the flocculated carbon nanotube film will increase the specific surface area of the carbon nanotube structure. Further, the carbon nanotube structure employing the flocculated carbon nanotube film has excellent durability, and can be fashioned into desired shapes with a low risk to the integrity of the flocculated carbon nanotube film, due to the carbon nanotubes in the flocculated carbon nanotube film being entangled with each other. The thickness of the flocculated carbon nanotube film can range from about 0.5 nanometers to about 1 millimeter. The flocculated carbon nanotube film is fabricated via a flocculating process. The flocculated carbon nanotube film can be fabricated by providing carbon nanotubes, flocculating the carbon nanotubes in a solvent to acquire a carbon nanotube floccule structure, separating the carbon nanotube floccule structure from the solvent, and shaping the separated carbon nanotube floccule structure into the flocarbon nanotube film in which the carbon nanotubes are entangled with each other and can be isotropic.

Pressed Carbon Nanotube Film

Figure 3:
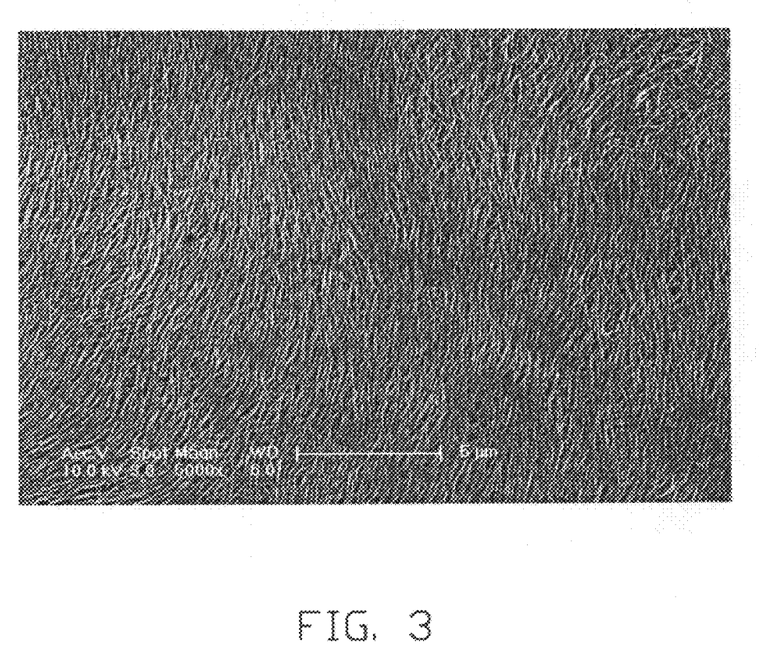
FIG. 3 is an SEM image of a pressed carbon nanotube film used in the generator of FIG. 1.

In one embodiment, the carbon nanotube film may be a pressed carbon nanotube film. The pressed carbon nanotube film can be a free-standing carbon nanotube film. The carbon nanotubes in the pressed carbon nanotube film are arranged along a same direction or arranged along different directions. Referring to FIG. 3, the carbon nanotubes in the pressed carbon nanotube film are arranged along a same direction. The carbon nanotubes in the pressed carbon nanotube film can rest upon each other. Adjacent carbon nanotubes are attracted to each other and combined by van der Waals attractive force. An angle between a primary alignment direction of the carbon nanotubes and a surface of the pressed carbon nanotube film is approximately 0 degrees to approximately 15 degrees. The greater the pressure applied, the smaller the angle formed. When the carbon nanotubes in the pressed carbon nanotube film are arranged along different directions, the pressed carbon nanotube film can be isotropic. The thickness of the pressed carbon nanotube film ranges from about 0.5 nm to about 1 mm. Examples of pressed carbon nanotube film are taught by US application 20080299031A1 to Liu et al. The pressed carbon nanotube film can be executed by providing an array of carbon nanotubes formed a substrate; and providing a pressing device to press the array of carbon nanotubes, thereby forming the pressed carbon nanotube film.

Drawn Carbon Nanotube Film

Figure 4:
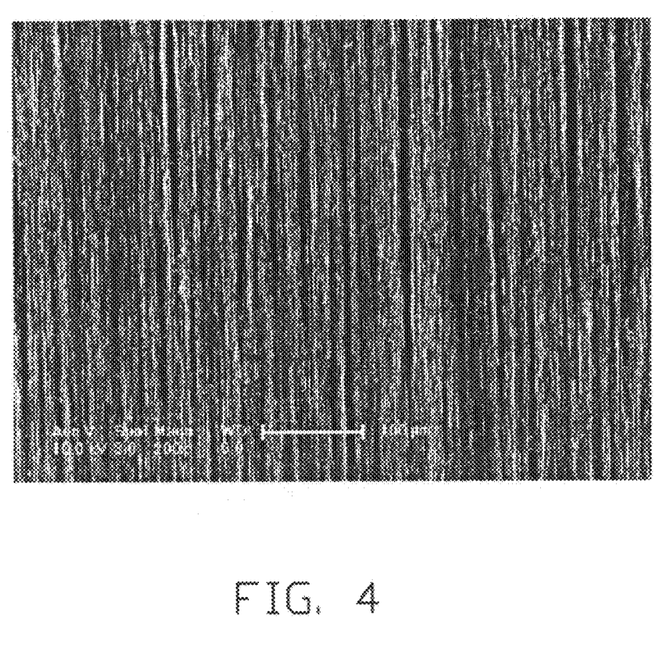
FIG. 4 is an SEM image of a drawn carbon nanotube film used in the generator of FIG. 1.
Figure 5:
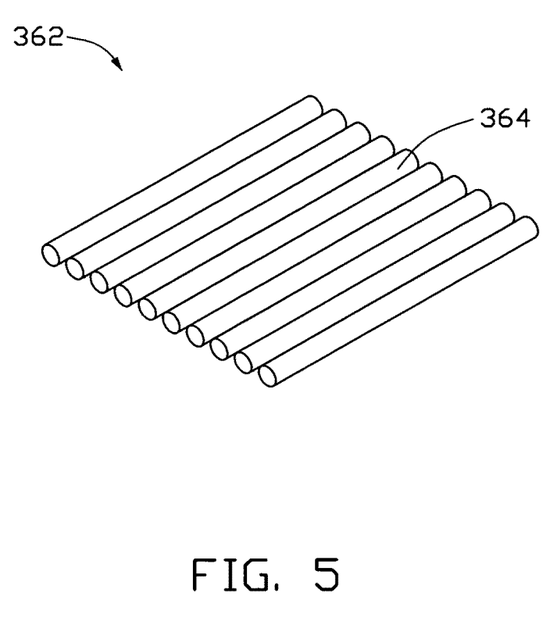
FIG. 5 is a schematic view of a carbon nanotube segment of the drawn carbon nanotube film of FIG. 4.

In one embodiment, the carbon nanotube film structure includes at least one drawn carbon nanotube film. A film can be drawn from a super-aligned carbon nanotube array to form the drawn carbon nanotube film. Examples of drawn carbon nanotube film are taught by U.S. Pat. No. 7,045,108 to Jiang et al., and WO 2007015710 to Zhang et al. Referring to FIG. 4, the drawn carbon nanotube film includes a plurality of successive and oriented carbon nanotubes joined end-to-end by van der Waals attractive force therebetween. The drawn carbon nanotube film is a free-standing film. Referring to FIG. 5, the drawn carbon nanotube further includes a number of carbon nanotube segments 362 joined end to end via van der Waals. Each of the carbon nanotube segments 362 includes a number of carbon nanotubes 364 arranged substantially parallel to each other. The carbon nanotube segments 362 may have a random length, thickness, shape, and uniformity. The carbon nanotube film can be treated with an organic solvent to increase the mechanical strength and toughness of the carbon nanotube film and reduce the coefficient of friction of the carbon nanotube film. A thickness of the carbon nanotube film can range from about 0.5 nanometers to about 100 micrometers.

A method of making a drawn carbon nanotube film includes providing an array of carbon nanotubes and pulling out a drawn carbon nanotube film from the array of carbon nanotubes. Pulling can be aided by the use of a tool such as adhesive tape, pliers, tweezers, or other tools allowing multiple carbon nanotubes to be gripped and pulled simultaneously. The drawn carbon nanotube film can be formed by selecting one or more carbon nanotubes having a predetermined width from the array of carbon nanotubes and pulling the carbon nanotubes at a uniform speed to form carbon nanotube segments that are joined end to end to achieve a uniform drawn carbon nanotube film.

The carbon nanotube segments can be selected by using the tool allowing multiple carbon nanotubes to be gripped and pulled simultaneously to contact with the array of carbon nanotubes. The pulling direction can be substantially perpendicular to the growing direction of the array of carbon nanotubes.

More specifically, during the pulling process, as the initial carbon nanotube segments are drawn out, other carbon nanotube segments are also drawn out end to end due to van der Waals attractive force between ends of adjacent segments. This process of pulling produces a substantially continuous and uniform carbon nanotube film having a predetermined width. A microporous structure is defined by the carbon nanotubes when the angle between the aligned directions of the carbon nanotubes in adjacent carbon nanotube films is larger than 0 degrees. The carbon nanotube structure in an embodiment employing these films will have a plurality of micropores. The micropores have diameters which can range from about 1 nm from 0.5 mm. Stacking the carbon nanotube films will also add to the structural integrity of the carbon nanotube structure.

Understandably, the carbon nanotube film structure may further include at least two stacked carbon nanotube films. Additionally, when the carbon nanotubes in the carbon nanotube film are substantially aligned along one preferred orientation (e.g., the drawn carbon nanotube film), an angle can exist between the orientation of carbon nanotubes in adjacent films. Adjacent carbon nanotube films can be combined by only the van der Waals attractive force therebetween. The number of layers of the carbon nanotube films is not limited by the length of the carbon nanotube structure. However the thicker the carbon nanotube structure, the smaller the specific surface area. An angle between the aligned directions of the carbon nanotubes in two adjacent carbon nanotube films can range from about 0 degrees to about 90 degrees.

Linear Carbon Nanotube Structure

In other embodiment, the linear carbon nanotube structure includes carbon nanotube wires and/or carbon nanotube cables. The carbon nanotube wires may be folded or entangled into a carbon nanotube layer structure. Otherwise, the carbon nanotube wires may be substantially parallel to each other and joined side by side into a layer structure. Furthermore, the carbon nanotube wires can be crossed or braided into a net.

The untwisted carbon nanotube wire can be formed by treating the drawn carbon nanotube film with an organic solvent. Specifically, the drawn carbon nanotube film is treated by applying the organic solvent to the carbon nanotube film to soak the surface of the drawn carbon nanotube film without being adhered on a substrate. After being soaked by the organic solvent, the adjacent parallel carbon nanotubes in the drawn carbon nanotube film will bundle together, due to the surface tension of the organic solvent when the organic solvent volatilizes, and thus, the drawn carbon nanotube film will be shrunk into untwisted carbon nanotube wire. The carbon nanotubes of the untwisted carbon nanotube wire are substantially parallel to each other and substantially arranged along the longitudinal axis of the untwisted carbon nanotube wire.

The twisted carbon nanotube wire can be formed by twisting a drawn carbon nanotube film by using a mechanical force to turn the two ends of the drawn carbon nanotube film in opposite directions. Further, the twisted carbon nanotube wire is treated by applying the organic solvent. After being soaked by the organic solvent, the adjacent parallel carbon nanotubes in the twisted carbon nanotube film will bundle together, due to the surface tension of the organic solvent when the organic solvent volatilizes, and thus, the twisted carbon nanotube wire may have less specific surface area, and larger density and strength. The carbon nanotubes of the untwisted carbon nanotube wire helically twist along the longitudinal axis of the untwisted carbon nanotube wire.

The carbon nanotube cable includes two or more carbon nanotube wires. The carbon nanotube wires in the carbon nanotube cable can be twisted or untwisted. In an untwisted carbon nanotube cable, the carbon nanotube wires are substantially parallel with each other. In a twisted carbon nanotube cable, the carbon nanotube wires are twisted with each other.

Carbon Nanotube Array

In one embodiment, the carbon nanotube structure can be a carbon nanotube array which can be obtained via chemical vapor deposition or other. The carbon nanotube array includes a plurality of carbon nanotubes arranged substantially parallel to each other.

Carbon Nanotube Composite Structure

In the carbon nanotube composite structure, a mass percent of the carbon nanotube may be larger than 80 percent. A method of fabricating the carbon nanotube composite structure employing the carbon nanotube structure and the organic polymer matrix may include the following steps. The carbon nanotube structure is immersed into a solution of the organic polymer matrix with the addition of a curing agent. The solution is solidified and the carbon nanotube composite structure is achieved. A method of fabricating the carbon nanotube composite structure employing the carbon nanotube structure and the inorganic polymer matrix may include the following steps. The carbon nanotube structure is immersed into a solution of metal powder or inorganic powder. The solvent of the solution is volatilized and the carbon nanotube composite structure is achieved. Furthermore, the carbon nanotube composite structure may be fabricated via employing other methods. For example, the carbon nanotubes is mixed into a solvent (1,2-dichloroethane) and ultrasonically vibrated to uniformly dispersed the carbon nanotubes into the solvent to obtain a solution. The solution of the carbon nanotubes is mixed with an inorganic carrier to form a mixture. The mixture is then solidified, resulting in the carbon nanotube composite structure.

In one embodiment, the heat absorption module 314 includes a carbon nanotube structure having a number of the drawn carbon nanotube films stacked together. Since the drawn carbon nanotube film has excellent durability, it can be folded into any shape as desired. Moreover, the carbon nanotubes have excellent absorption capacity for solar energy as the capacity of absorbing electric-magnetic waves of the carbon nanotubes is substantially the same as that of an absolute blackbody. Therefore, the carbon nanotubes can absorb about 93 percent to about 98 percent solar energy irradiating thereon.

The first light selective-transport layer 322 and the second light selective-transport layer 324 may be ultrared selective-transport layers. Thus, the first and second selective-transport layers 322, 324 can have high transmission rate of ultraviolet, visible light, and near infrared light, and reflect far infrared light. When the heat absorption module 314 absorbs energy, it may radiate far infrared light. The far infrared light can be reflected onto the heat absorption module 314 by the first and second selective-transport layers 322, 324 and then absorbed again by the heat absorption module 314, thereby improving the absorption rate of the heat collector 320. The first and second selective-transport layers 322, 324 can be made of indium tin oxide, zinc aluminum oxide, carbon nanotube film, or carbon nanotube composite film. In one embodiment, the first and second selective-transport layers 322, 324 are made of indium tin oxide and have a thickness of about 10 nm to about 1 μm.

The supporter 326 is interposed between the heat absorption module 314 and the heat-electricity transforming device 330, and contact the heat absorption module 314. The supporter 326 is configured to support the heat absorption module 314 and made of material having a good thermal conductivity coefficient, such as glass, copper, aluminum, or the like.

The generator 300 may further include at least one spacer (not shown). The spacer may have a same height as that of the sidewall 316 and be made of material having a poor thermal conductivity, such as glass, ceramic. When the top and bottom substrates 310, 312 have a larger area, the spacer is sandwiched between the top and bottom substrate 310, 312 to resist the atmospheric pressure. Understandably, when the top and bottom substrates 310, 312 have a smaller area, the spacer can be omitted.

The heat-electricity transforming device 330 is received in the container 318 of the heat collector 320 and positioned between the second light selective-transport layer 324 and the supporter 326. The heat-electricity transforming device 330 includes a number of first electrodes 332, a number of second electrodes 334, a number of P-type heat-electricity modules 336 and a number of N-type heat-electricity modules 338. The P-type heat-electricity modules 336 and the N-type heat-electricity modules 338 are alternately arranged and spaced apart from each other. Each of the P-type heat-electricity modules 336 may be substantially parallel to each of the N-type heat-electricity modules 338. Each N-type heat-electricity module 336 is located between two adjacent P-type heat-electricity modules 336. The P-type and N-type heat-electricity modules 336, 338 are electrically connected in series via the first and second electrodes 332, 334. When the heat-electricity transforming device 330 works, current alternately flows into the P-type and N-type heat-electricity transforming devices 336, 338 in order. In one embodiment, the first electrodes 332 are electrically mounted between the top of two adjacent P-type and N-type heat-electricity modules 336, 338 and the supporter 326. The second electrodes 334 are electrically mounted at the bottom of the two adjacent P-type and N-type heat-electricity modules 336, 338 and the second light selective transport layer 324.

The cooling device 340 is disposed on the bottom substrate 312 and outside of the container 318 to increase in the temperature difference between the high temperature area and the low temperature area of the heat-electricity transforming device 330, thereby improving heat-electricity transforming rate of the heat-electricity transforming device 330. The cooling device 340 may be, for example, a water-cooled device.

The heat-electricity rate of the generator 300 is improved because the heat absorption module 314 includes the carbon nanotube structure having a larger than 98 percent absorption rate of visible light, and the heat absorption module 314 and the heat-electricity transforming device 330 are received in the container 318, whereby the heat loss is decreased and the temperature of the high temperature area of the heat-electricity transforming device 330 is increased.

Understandably, the generator 300 may only include the heat collector 320 and the heat-electricity transforming device 330, and the heat collector 320 may only include the heat absorption module 314. When the generator 300 only includes the heat collector 320 and the heat-electricity transforming device 330, the heat absorption module 314 can be directly mounted on the first electrodes 332 of the heat-electricity transforming device 330.

Figure 6:
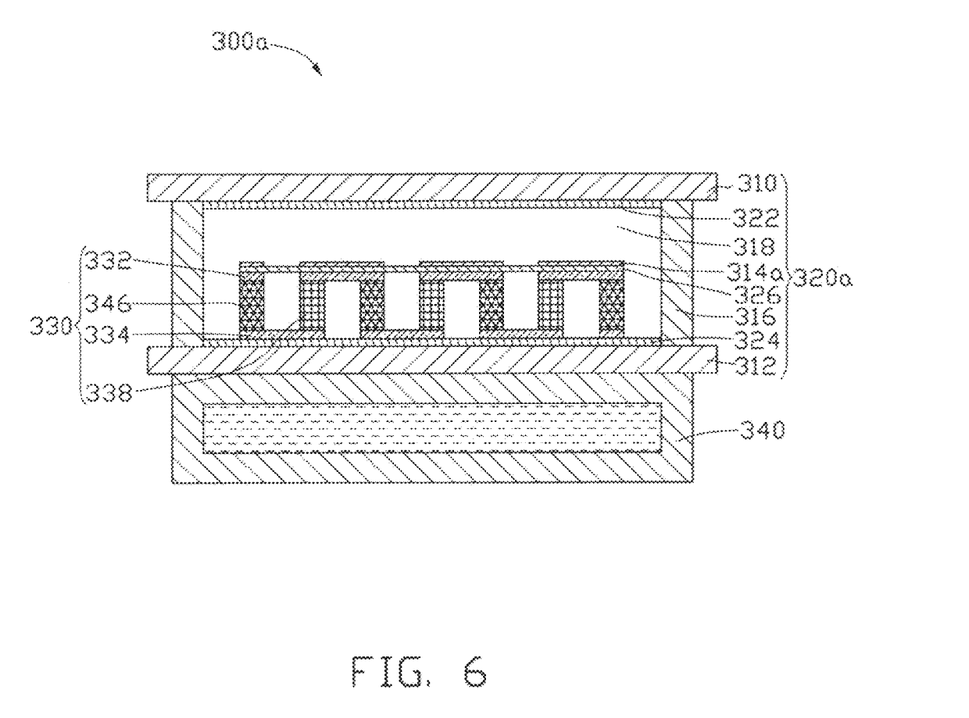
FIG. 6 is a schematic, cross-sectional view of a second embodiment of a generator.

Referring to FIG. 6, a second embodiment of a generator 300a is similar to the first embodiment of the generator 300 except for heat absorption modules 314a of a heat collector 320a. The generator 300a includes a number of separated heat absorption modules 314a and each heat absorption modules 314a is in alignment with a corresponding first electrode 332. The number of the heat absorption modules 314a is the same as the first electrodes 332.

Figure 7:
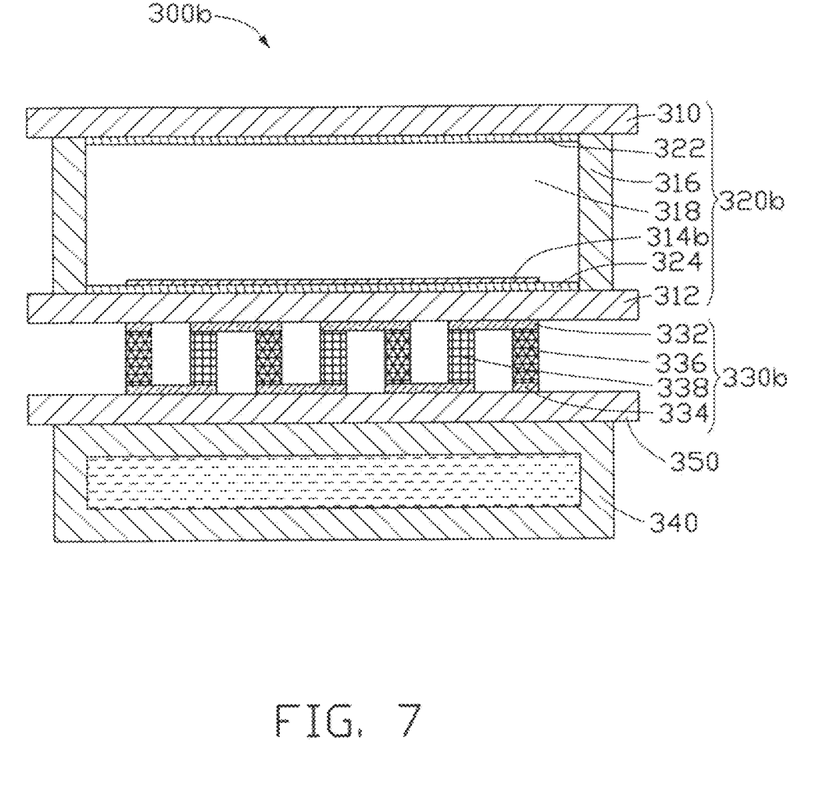
FIG. 7 is a schematic, cross-sectional view of a third embodiment of a generator.

Referring to FIG. 7, a third embodiment of a generator 300b is similar to the first embodiment of the generator 300 except for the locations of a heat absorption module 314b and a heat-electricity transforming device 330b. The heat-electricity transforming device 330b is located between a heat collector 320b and the cooling device 340. The heat absorption module 314b is received in the container 318 and directly located on the second light selective transport layer 324. As shown in FIG. 7, surface of the carbon nanotube layer of the heat absorption module 314b that faces the first substrate 310 is entirely exposed to transmitted light from the first substrate 310.

Figure 8:
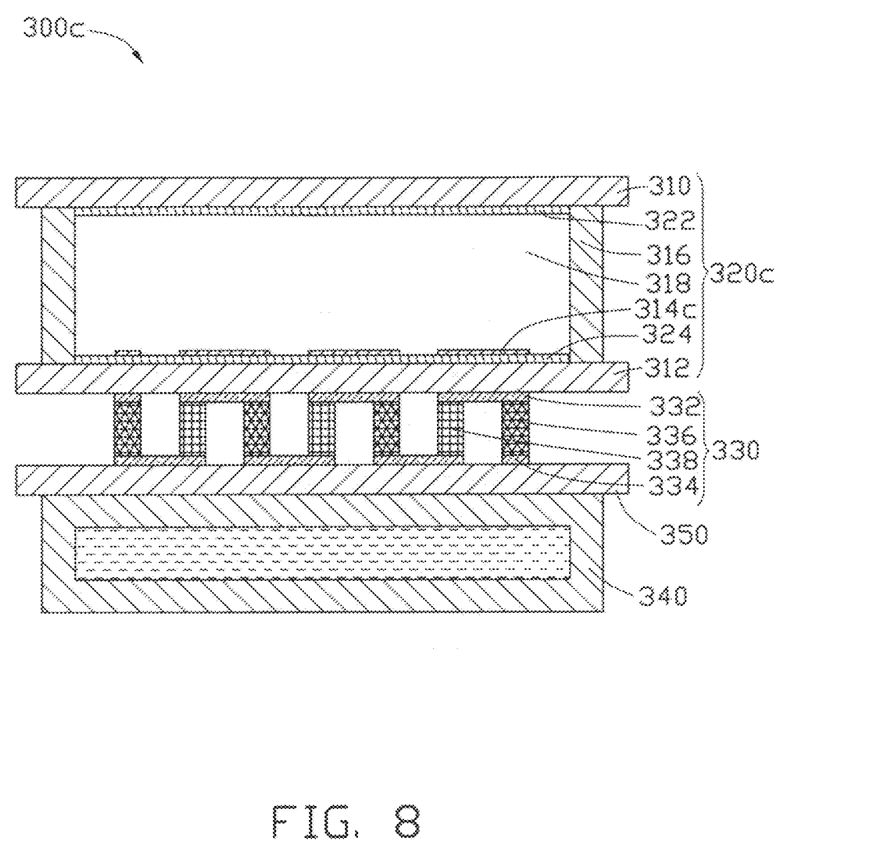
FIG. 8 is a schematic, cross-sectional view of a fourth embodiment of a generator.

Referring to FIG. 8, a fourth embodiment of a generator 300c is similar to the third embodiment of the generator 300b except for the structure of heat absorption modules 314c of the heat collector 320c. The generator 300c includes a number of separated heat absorption modules 314c and each heat absorption module 314c is in alignment with a corresponding first electrode 332. The number of the heat absorption modules 314c is the same as the first electrodes 332.

It is to be understood, however, that even though numerous characteristics and advantages of one embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A generator, comprising:
a heat collector comprising a container, wherein the container comprises a first substrate allowing light to transmit to form a transmitted light and a second substrate parallel with the first substrate;
a heat-electricity transforming device located outside of the container and in contact with the second substrate, wherein the heat-electricity transforming device is configured to transform heat into electricity, and the heat-electricity transforming device comprises a plurality of first electrodes, a plurality of second electrodes, a plurality of P-type heat-electricity modules, and a plurality of N-type heat-electricity modules; the plurality of P-type heat-electricity modules and the plurality of N-type heat-electricity modules are alternately arranged and spaced apart from each other; the plurality of first electrodes and the plurality of second electrodes are alternately arranged and spaced apart from each other; and the plurality of P-type heat-electricity modules and the plurality of N-type heat-electricity modules are electrically connected in series via the plurality of first electrodes and the plurality of second electrodes; and
a carbon nanotube layer located in the container and on the second substrate, wherein the carbon nanotube layer comprises a first surface facing the first substrate and a second surface opposite to the first surface, the first surface is entirely exposed to the transmitted light so that the carbon nanotube layer absorbs the transmitted light, and the second surface is connected to the heat-electricity transforming device through the second substrate to transfer heat to the heat-electricity transforming device; and the surface of the carbon nanotube layer that faces the first substrate is entirely exposed to the transmitted light; wherein the carbon nanotube layer is a plurality of carbon nanotube layers spaced from each other and corresponding to the plurality of first electrodes, and each of the plurality of carbon nanotube layers covers one of the plurality of first electrodes.

2. The generator of claim 1, further comprising a cooling device located outside of the container and thermally connected to the plurality of second electrodes.

3. The generator of claim 1, wherein the carbon nanotube layer comprises a carbon nanotube film comprising a plurality of carbon nanotubes joined end to end and oriented substantially along the same direction.

4. The generator of claim 3, wherein the carbon nanotube layer comprises two carbon nanotube films stacked with each other.

5. The generator of claim 1, wherein the carbon nanotube layer comprises carbon nanotube film comprising a plurality of carbon nanotubes entangled with each other.

6. The generator of claim 1, wherein the carbon nanotube layer comprises a plurality of carbon nanotube wires crossed with each other or braided into a net.

7. The generator of claim 1, wherein the carbon nanotube layer comprises a plurality of carbon nanotube wires substantially parallel to each other and arranged side by side.

8. The generator of claim 1, wherein the carbon nanotube layer is a composite comprising a matrix and a plurality of carbon nanotubes dispersed in the matrix.

9. The generator of claim 8, wherein the matrix comprises material selected from the group consisting of inorganic material, metal material, and polymer.

10. The generator of claim 1, wherein the container further comprises a first light selective transport layer located in the container and on a surface of the first substrate.

11. The generator of claim 10, wherein the first light selective transport layer comprises material selected from the group consisting of indium tin oxide, zinc aluminum oxide, and carbon nanotubes.

12. The generator of claim 10, wherein the container further comprises a second light selective transport layer located in the container and between the second substrate and the heat-electricity transforming device.

13. The generator of claim 12, wherein the second light selective transport layer comprises material selected from the group consisting of indium tin oxide, zinc aluminum oxide, and carbon nanotubes.

* * * * *